(12) United States Patent
Beer et al.

(10) Patent No.: US 7,504,711 B2
(45) Date of Patent: Mar. 17, 2009

(54) SEMICONDUCTOR SUBSTRATE WITH STRIP CONDUCTORS FORMED OF CARBON NANOTUBES AND PRODUCTION THEREOF

(75) Inventors: Gottfried Beer, Nittendorf (DE); Jochen Dangelmaier, Beratzhausen (DE); Alfred Haimerl, Sinzing (DE); Manfred Mengel, Bad Abbach (DE); Klaus Mueller, Regensburg (DE); Klaus Pressel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/625,393

(22) Filed: Jan. 22, 2007

(65) Prior Publication Data
US 2007/0210883 A1   Sep. 13, 2007

Related U.S. Application Data

(63) Continuation of application No. PCT/DE2005/001226, filed on Jul. 12, 2005.

(30) Foreign Application Priority Data
Jul. 21, 2004   (DE) .................. 10 2004 035 368

(51) Int. Cl.
*H01L 39/00* (2006.01)
(52) U.S. Cl. .................. 257/664; 977/712; 977/720; 977/742
(58) Field of Classification Search .................. 977/701, 977/707, 712, 720, 742; 333/238, 246; 257/664
See application file for complete search history.

(56) References Cited

U.S. PATENT DOCUMENTS

| | | | |
|---|---|---|---|
| 5,774,340 A | 6/1998 | Chang et al. | |
| 6,183,714 B1 | 2/2001 | Smalley et al. | |
| 6,420,092 B1 * | 7/2002 | Yang et al. ................ | 430/311 |
| 6,626,684 B1 | 9/2003 | Stickler et al. | |
| 6,927,982 B2 | 8/2005 | Mergenthaler | |
| 7,129,097 B2 * | 10/2006 | Furukawa et al. ............ | 438/1 |
| 7,229,909 B2 * | 6/2007 | Furukawa et al. ......... | 438/622 |
| 2001/0023986 A1 | 9/2001 | Mancevski | |
| 2002/0014667 A1 | 2/2002 | Shin et al. | |
| 2002/0163079 A1 | 11/2002 | Awano | |
| 2003/0179559 A1 | 9/2003 | Engelhardt et al. | |
| 2003/0193291 A1 | 10/2003 | Im et al. | |

(Continued)

FOREIGN PATENT DOCUMENTS

EP   1069206 A2   1/2001

(Continued)

OTHER PUBLICATIONS

Peter Clarke, "Two Apply Carbon Nanotubes to Chip Packaging, Delivery," Silicon Strategies, Jul. 9, 2004, www.siliconstrategies.com.

(Continued)

*Primary Examiner*—Benny Lee
(74) *Attorney, Agent, or Firm*—Edell, Shapiro & Finnan, LLC

(57) ABSTRACT

A substrate including strip conductors with a wiring pattern that connects contact areas to one another. The strip conductors have a small strip conductor width. The contact areas and/or the strip conductors form a narrow connection pitch and include electrically conductive carbon nanotubes.

16 Claims, 9 Drawing Sheets

U.S. PATENT DOCUMENTS

| | | |
|---|---|---|
| 2003/0199172 A1 | 10/2003 | Rueckes et al. |
| 2003/0228467 A1 | 12/2003 | Liebau et al. |
| 2004/0099438 A1 | 5/2004 | Arthur et al. |

FOREIGN PATENT DOCUMENTS

| | | |
|---|---|---|
| EP | 1069587 A2 | 1/2001 |
| EP | 1277858 B1 | 11/2006 |
| JP | 200431679 | 1/2004 |

OTHER PUBLICATIONS

Suzanne Shelley, "Carbon Nanotubes: A Small-Scale Wonder," Chemical Engineering, Feb. 2003.

J. Li et al., "Highly-Ordered Carbon Nanotube Arrays for Electronics Applications," Applied Physics Letters, vol. 75, No. 3, Jul. 19, 1999, XP-002343518.

* cited by examiner

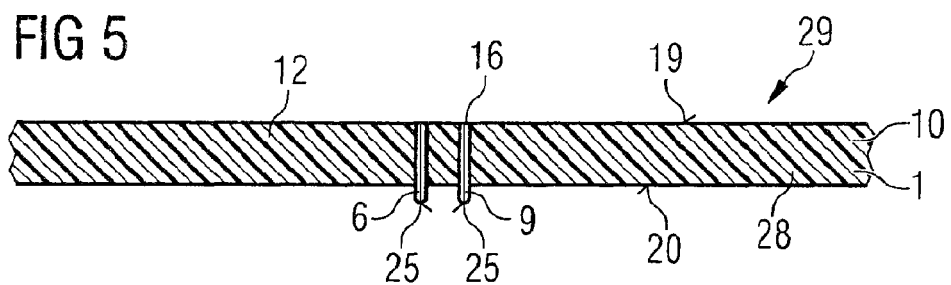
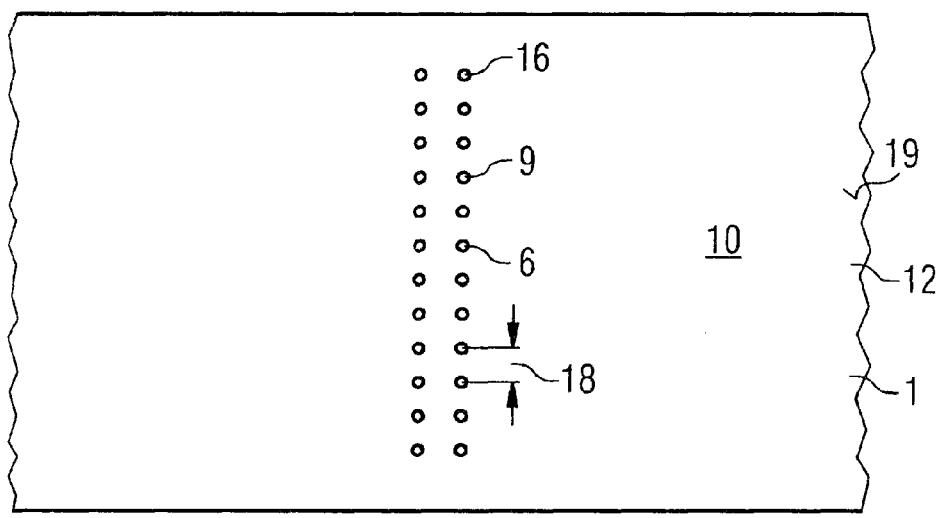
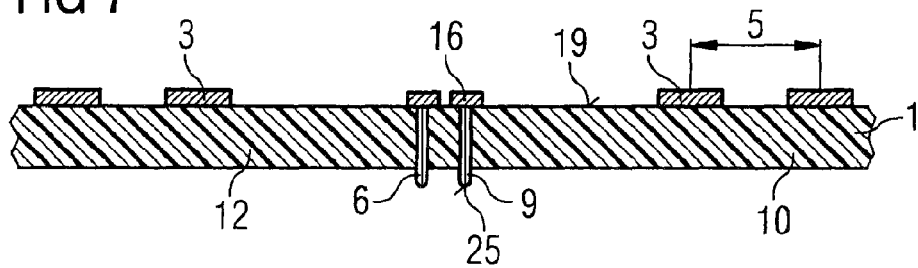

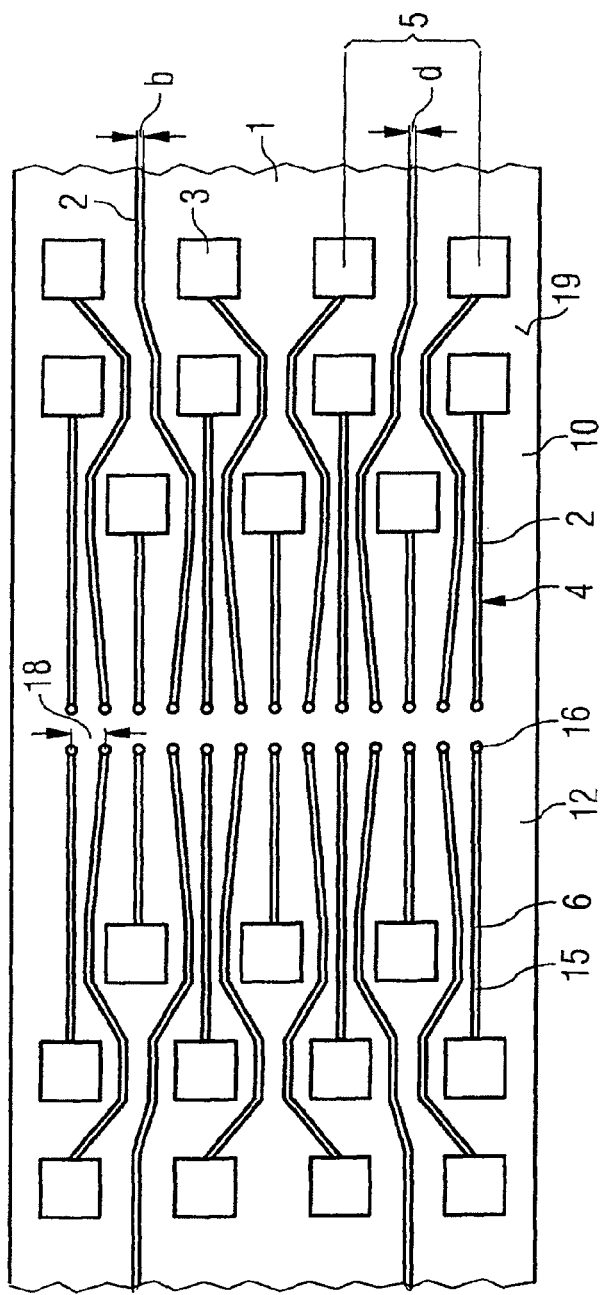
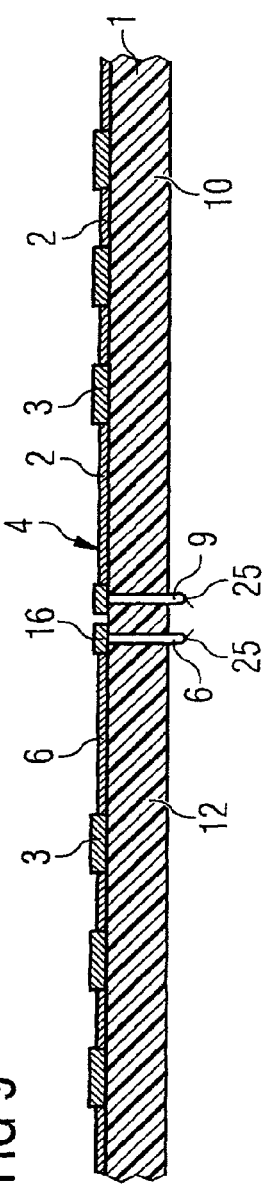

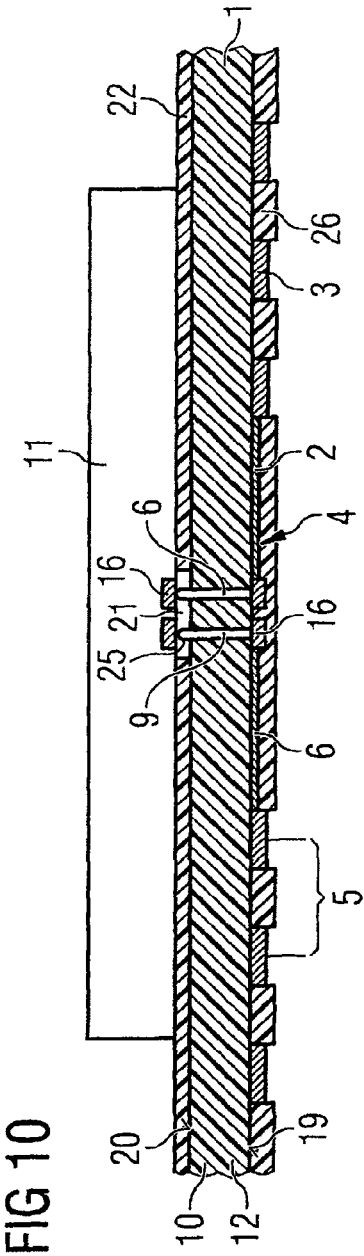
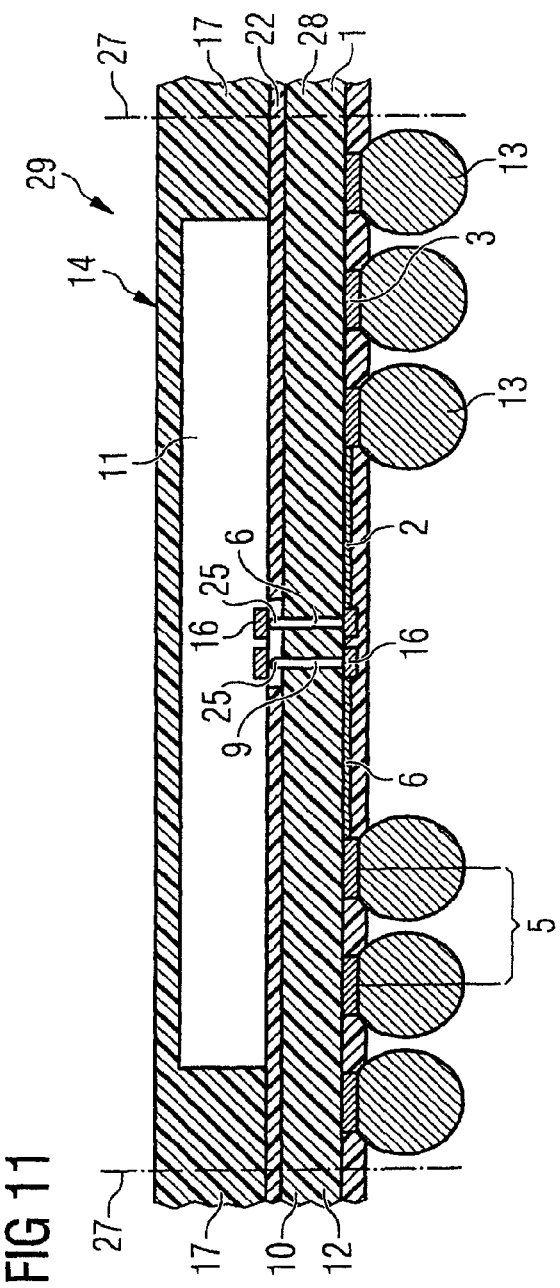

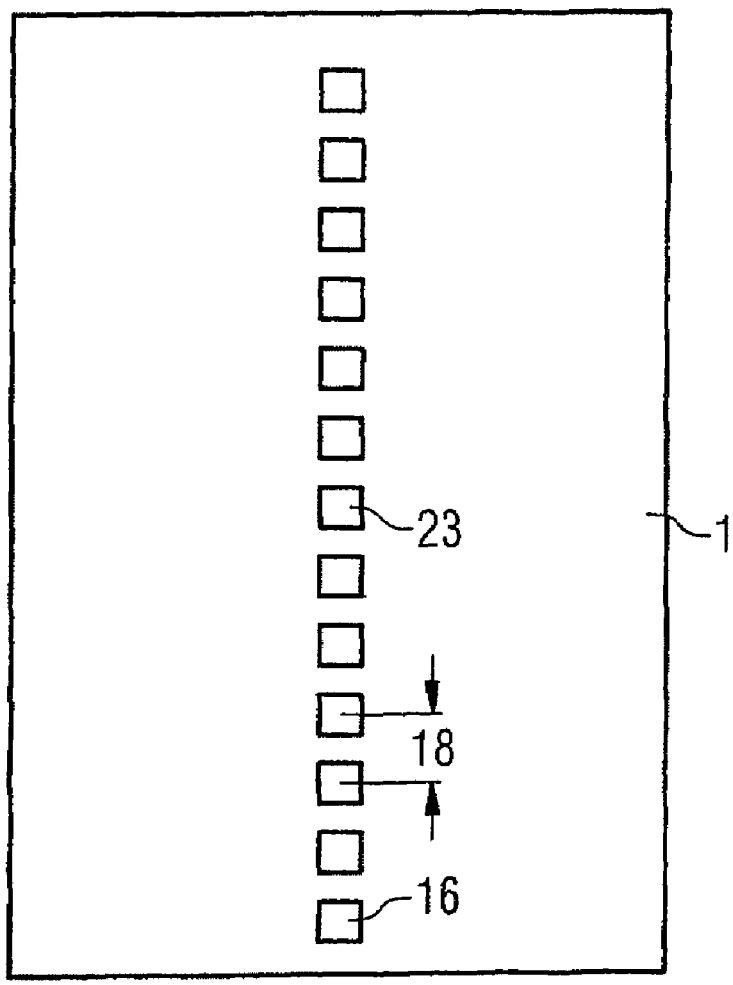
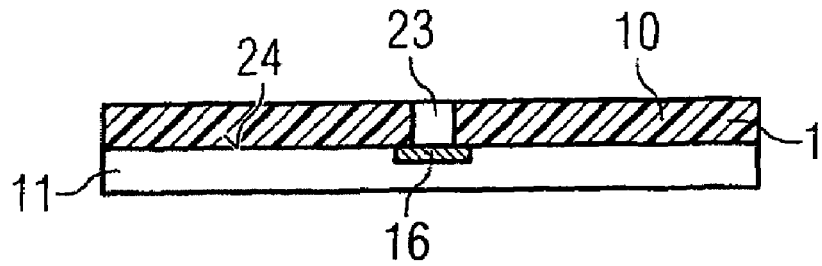

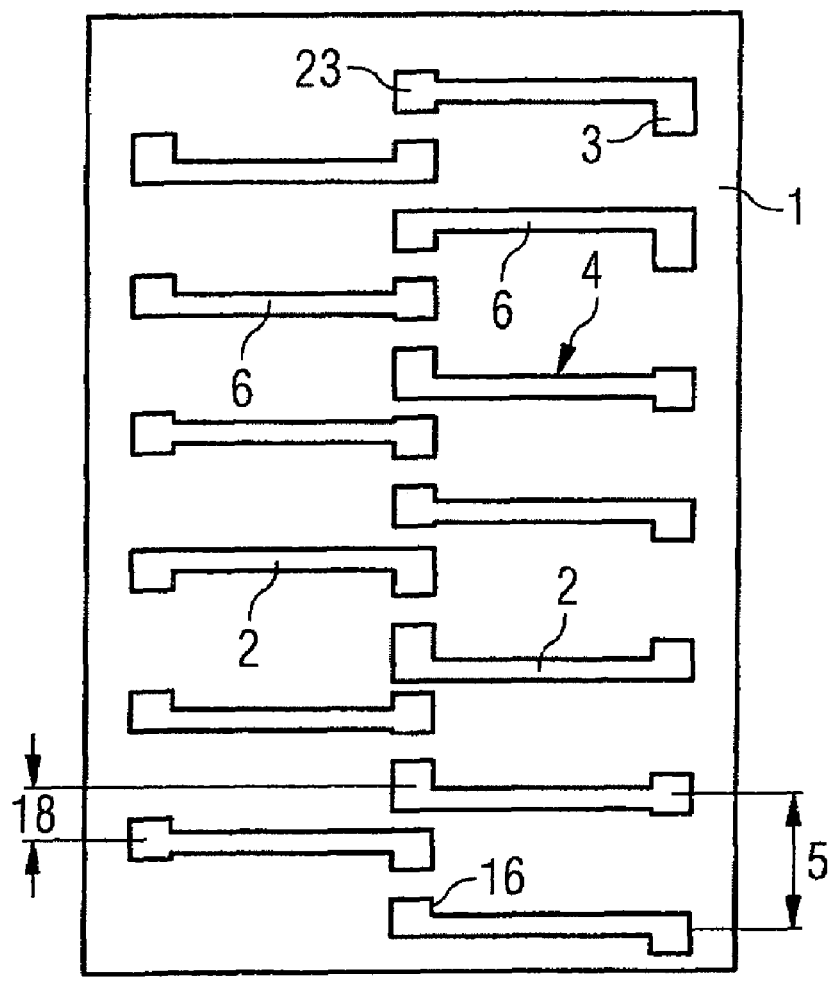
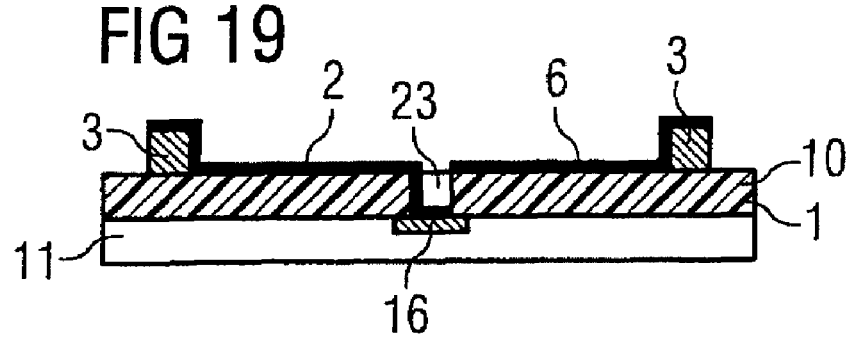

SEMICONDUCTOR SUBSTRATE WITH STRIP CONDUCTORS FORMED OF CARBON NANOTUBES AND PRODUCTION THEREOF

CROSS REFERENCE TO RELATED APPLICATIONS

This application is a continuation of International Application No. PCT/DE2005/001226, filed on Jul. 12, 2005, entitled "Substrate with Strip Conductors and Production of Strip Conductors on Substrates for Semiconductor Components," which claims priority under 35 U.S.C. §119 to Application No. DE 102004035368.9 filed on Jul. 21, 2004, entitled "Substrate with Strip Conductors and Production of Strip Conductors on Substrates for Semiconductor Components," the entire contents of which are hereby incorporated by reference.

BACKGROUND

Known semiconductor components are typically constructed with connection pitches of the order of magnitude of a few hundred micrometers to a minimum of approximately 50 μm. Semiconductor components with connection pitches to a minimum of approximately 20 μm are in the development stage. It is foreseeable, however, that the connection densities, i.e., the number of required contacts with a constant semiconductor chip area, will increase even further, or that the size of the connection areas and the distances between them will be shrunk even further. For these new semiconductor components or semiconductor chips, substrates with strip conductors are required for mounting.

A known socket couples semiconductor components with integrated circuits or semiconductor chips to a printed circuit board. The socket is multilayered and includes a layer with a substrate with passage openings and an electrically conductive carbon nanotube structure being arranged at least in one of the passage openings. One disadvantage of this substrate with passage lines made from carbon nanotubes is the linear-dimensional and orientation of the carbon nanotube structure in a through contact opening orthogonally with respect to the substrate surface, which cannot be transferred to horizontal wiring structures with a narrow connection pitch.

SUMMARY OF THE INVENTION

Described herein is a substrate including strip conductors and contact areas. The strip conductors include a wiring pattern that connects the contact areas to one another. The strip conductors furthermore have a small strip conductor width. The contact areas and/or the strip conductors form a narrow connection pitch and include electrically conductive carbon nanotubes. A related method involves the production and application of strip conductors to substrates for semiconductor components with a narrow connection pitch and small strip conductor width or small strip conductor diameter.

The above and still further features and advantages of the substrate and method will become apparent upon consideration of the following definitions, descriptions and descriptive figures of specific embodiments thereof, wherein like reference numerals in the various figures are utilized to designate like components. While these descriptions go into specific details of the substrate and method, it should be understood that variations may and do exist and would be apparent to those skilled in the art based on the descriptions herein.

BRIEF DESCRIPTION OF THE DRAWINGS

The invention is explained in more detail below with reference to exemplary embodiments, where:

FIG. 5 shows a schematic cross section through a substrate with through contacts with carbon nanotube technology;

FIG. 6 shows a schematic plan view of a substrate with through contacts with carbon nanotube technology adapted to a semiconductor chip with a central bonding channel;

FIG. 7 shows a schematic cross section through the substrate in accordance with FIG. 5 with applied contact connection areas;

FIG. 8 shows a schematic plan view of the substrate in accordance with FIG. 7 with applied carbon nanotube wiring;

FIG. 9 shows a schematic cross section through the substrate in accordance with FIG. 8;

FIG. 10 shows a schematic cross section through the substrate in accordance with FIG. 9 after the application of a semiconductor chip with a central bonding channel;

FIG. 11 shows a schematic cross section through components of a semiconductor component after the application of a plastic composition and after the application of external contacts;

FIG. 12 shows a schematic plan view of a substrate with a semiconductor chip and openings in the substrate to contact areas of the semiconductor chip;

FIG. 13 shows a schematic cross section through the semiconductor chip in accordance with FIG. 12;

FIG. 18 shows a schematic plan view of the substrate in accordance with FIG. 17 after the formation of nanotube connections in the printed-on material;

FIG. 19 shows a schematic cross section through the substrate in accordance with FIG. 18;

DETAILED DESCRIPTION OF THE INVENTION

Figure 1:
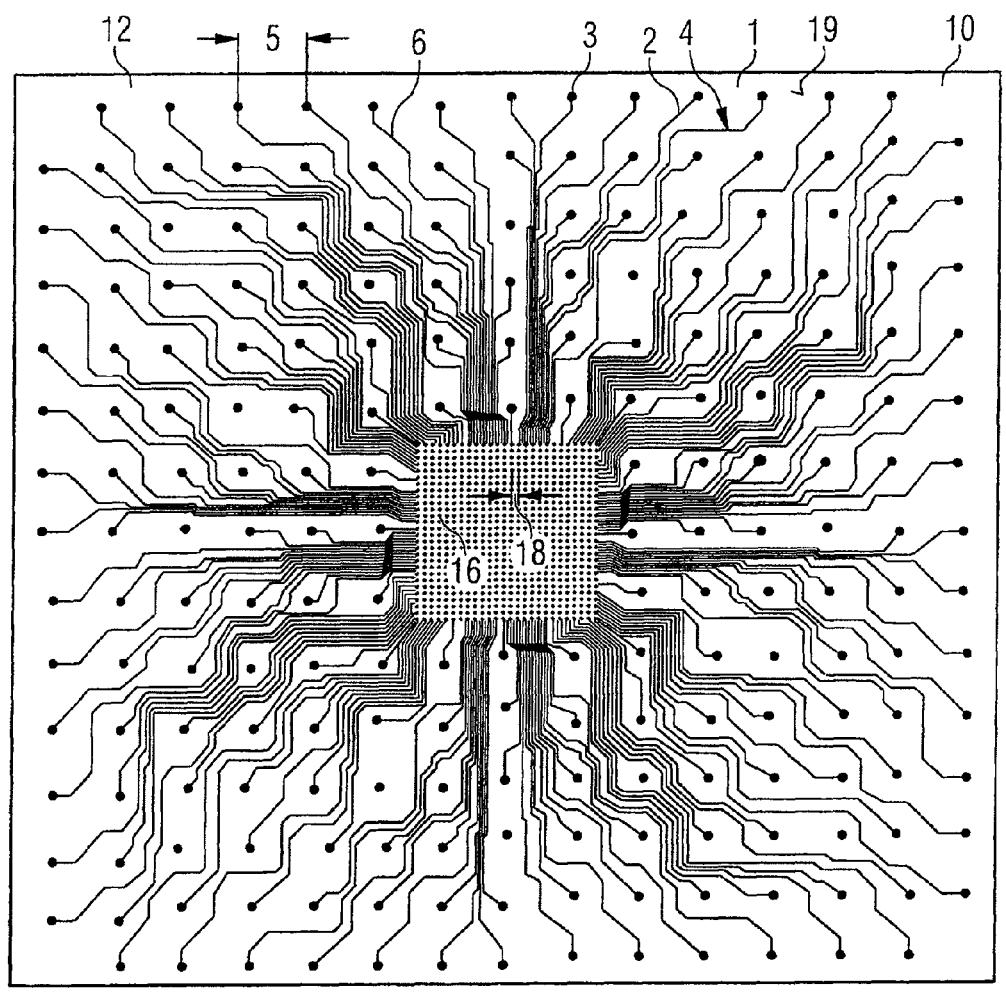
FIG. 1 shows a schematic plan view of a substrate with a wiring pattern using carbon nanotube technology.

As used herein, a "narrow connection pitch" is understood to be a connection pitch with a distance between the strip conductors of approximately 100 nanometers to approximately 10 micrometers. "Small strip conductor width or small strip conductor diameter" refers to the case in which the width or the diameter of the strip conductors on the substrate lies between approximately 10 nanometers and approximately 10 micrometers. In the present text, the term "substrates" is used for all types of semiconductor chips, printed circuit boards or carrier boards which require strip conductors and/or contact areas of the order of magnitude and having a connection pitch of approximately 100 nanometers to approximately 10 micrometers.

The described device and method relate to a substrate with strip conductors and production of the strip conductors on a top side of the substrate for semiconductor components.

The substrate, with strip conductors and contact areas, includes a wiring pattern on a top side of the substrate formed from the strip conductors. The wiring pattern connects contact areas to one another via the strip conductors. For this purpose, the strip conductors have a small strip conductor width or a small strip conductor diameter. In addition, the contact areas and/or the strip conductors form a narrow connection pitch on the substrate and comprise electrically conductive carbon nanotubes.

One advantage of the described substrate is that the previous connection pitch in development of 20 micrometers, in semiconductor components, can be reduced by several orders of magnitude down to 100 nanometers. A further advantage is the extremely small strip conductor width, or an extremely small strip conductor diameter, which can be achieved with carbon nanotubes. Such carbon nanotubes enable strip conductors having a preferred width of between 10 nanometers and 30 nanometers if the strip conductor comprises a single multiwalled carbon nanotube. In the case of single-walled carbon nanotubes, strip conductor diameters of 0.6 to 1.8 nanometers can be achieved.

Moreover, the carbon nanotubes have the added advantage of a low density which, with a value of 1.33 to 1.4 g/cm$^2$, is a factor of 2 lower than the density of aluminum used hitherto for metallic strip conductors on semiconductor chips. As compared with copper, copper having preferably been used hitherto as strip conductor material on printed circuit boards, when carbon nanotubes are used there is a resulting reduction in density by a factor of approximately 6. The tensile strength of electrically conductive carbon nanotubes, with a value of approximately $10^{11}$ Pa, is also several orders of magnitude better than in the case of metals, with the result that there is a lower risk of the strip conductors made from carbon nanotubes tearing away under high thermal loading on account of different coefficients of expansion of the materials involved in a semiconductor component or on a printed circuit board compared with conventional strip conductors made from metals.

Since carbon nanotubes have no grain boundaries, such as metals or carbon fibers, over their length of 10 nanometers to a few millimeters, their deformability and elasticity are significantly greater and breaking up or microcracking at grain boundaries such as occurs in the case of metallic strip conductors, is not possible. For strip conductors on substrates, it is crucial, moreover, that a high current-carrying capacity is possible. In the case of conventional metallic strip conductors, material migrations occur under high current loading so that the current loading in the case of strip conductors made from copper is limited to less than $1 \times 10^6$ A/cm$^2$ (1 million A/cm$^2$), whereas a current-carrying capacity of the strip conductors of up to $1 \times 10^9$ A/cm$^2$ is possible with carbon nanotubes.

The thermal conduction in such densely arranged strip conductor structures is likewise a factor which can make a crucial contribution to the improvement of a semiconductor component or a printed circuit board. For carbon nanotubes, it has been established that the thermal conductivity, with a value of 6000 watts per meter and degree Kelvin, is almost twice as high as in the case of diamond. Moreover, the properties can be improved further, particularly in terms of the current loading and breaking strength, via multiwalled carbon nanotubes as strip conductors. The diameter of such multiwalled carbon nanotubes lies between 2 and 300 nanometers, carbon nanotubes with a diameter d of between $10 \leq d \leq 30$ nm preferably being used for the application as strip conductors of a substrate of the described device.

This has the advantage that strip conductors comprising agglomerates of carbon nanotubes can be used on the substrate, which afford increased security, by virtue of a plurality of carbon nanotubes connected in parallel, against tearing away of the connection between two contact areas on a substrate. For this purpose, in one preferred embodiment, the strip conductors may include multiwalled carbon nanotubes lying alongside one another in the longitudinal direction.

In one exemplary embodiment, however, an individual strip conductor of the substrate includes an individual multiwalled carbon nanotube, whereby an extremely narrow connection pitch can advantageously be realized.

In a further exemplary embodiment, the strip conductors are embodied in multilayered fashion. For this purpose, the strip conductors include a base layer comprising a catalyst material, the catalyst material promoting the formation of carbon nanotubes from precursors. In addition, the strip conductors include a stack layer which, for its part, exhibits carbon nanotubes. This multilayered nature of the strip conductors has the advantage that strip conductors can be structured in a targeted manner on a substrate via first selectively applying the catalyst material and in structured fashion. On the base layer, the stack layer can then be formed on the base layer from a suspension comprising a solvent and precursors of carbon nanotubes.

For this purpose, the base layer may include a metal from the group including: nickel, iron, molybdenum, cobalt or alloys thereof. These catalyst materials can remain as structured base layers for strip conductors on the substrate and thus act as catalysts for the formation of carbon nanotubes wherever they are to be applied on the substrate. As seeds for the formation of carbon nanotubes, carbon fullerenes are preferably used, which are known as small balls of graphite and form single-walled, hexagonally structured hollow-spherical graphite particles. Under the influence of the catalyst material, the fullerenes as solids in a suspension generate nanotubes which can propagate along the strip conductors predetermined by the structure of the catalyst material.

In a further exemplary embodiment, the substrate includes a plurality of strip conductor layers with carbon nanotubes, the strip conductor layers being electrically insulated from one another by insulation layers. With a substrate of this type, the conducting line density can be increased further, and the strip conductors can advantageously be electrically interconnected through correspondingly prepared plated-through holes via carbon nanotubes in the insulation layers.

For this purpose, the substrate comprises at least one insulation layer that includes at least one carbon nanotube as a through contact through the insulation layer. As through contacts, however, in a further exemplary embodiment, the carbon nanotubes may also be formed as agglomerate in a passage opening through the insulation layer. In this case, the carbon nanotubes preferably form a columnar structure of carbon nanotubes that lie on one another and are oriented orthogonally with respect to the insulation layer as through contacts through the insulation layer. It is thus possible to realize extremely narrow three-dimensional connection pitches for strip conductors and/or contact areas with the aid of carbon nanotube technology for semiconductor components.

The substrate can be a circuit carrier. Such circuit carriers are used to connect narrow connection pitches of contact areas of a semiconductor chip to enlarged contact areas on the circuit carrier via corresponding strip conductors. Whereas the connection pitch for the contact areas of the semiconductor chip on the circuit carrier is designed to be extremely narrow, the connection pitch is extended to the order of magnitude of external contacts of a semiconductor component on the circuit carrier. Consequently, the circuit carrier comprises two different connection pitches, it being possible to reduce a narrow connection pitch in the region of the semiconductor chip to a few hundreds of nanometers via carbon nanotube technology, while another wide pitch dimension for the external contacts of the semiconductor chip can be extended to customary technical standards with the aid of the strip conductors of the substrate according to the described device.

In this context, a substrate is also understood to be a semiconductor chip, the strip conductors on the semiconductor chip being produced with the aid of carbon nanotube technology, so that the contact areas of the semiconductor chip can have a narrow connection pitch that has not been attained hitherto. For this purpose, the material of the substrate is a semiconductor material, preferably comprising monocrystalline silicon.

In a further embodiment, the substrate includes a plate-type insulating basic body comprising ceramic. With the aid of such ceramic plates, in particular in the form of multilayered ceramic plates with interposed strip conductor layers, it is possible to provide narrow connection pitches for wiring substrates, whereby the overall dimensions of a semiconductor component can be minimized further. Such ceramic substrates comprising incorporated carbon nanotubes as strip conductors can be used in particular for radio frequency components and integrated circuits for radio frequencies in the gigahertz and terahertz range.

Furthermore, the substrate may include an insulating baseplate comprising a plastic, preferably comprising a fiber-reinforced plastic, and constitute a printed circuit board or a panel on which a plurality of semiconductor chips can be arranged and wired with the aid of carbon nanotube technology.

Semiconductor components including such a substrate as semiconductor chip may constitute so-called "chip size" semiconductor components. In a preferred method for the production of strip conductors on substrates, carbon nanotubes are used via the liquid phase by application of a suspension comprising seeds for the formation of carbon nanotubes. This enables strip conductors that can be structured flexibly. Since the carbon nanotubes have a higher electrical conductivity, smaller structures are thus also possible for the strip conductor technology.

Moreover, it is possible to form entire networks of carbon nanotubes by printing-technological application of connections or strip conductors with corresponding precursors of the carbon nanotubes, which are then converted into the carbon nanotube network. For this purpose, it is possible, for example, to mix a suspension comprising a solution and carbon nanotube precursors with corresponding catalyst metal particles in the solvent, which is then applied selectively as suspension or solution to the semiconductor chips or substrate surfaces via printing technology. The conversion of the precursors of the carbon nanotubes into a carbon nanotube network is finally achieved via low-temperature processes.

In a first exemplary embodiment of the production of strip conductors comprising carbon nanotubes, in accordance with the described method, a printed circuit board basic body is first provided. The material of the printed circuit board basic body depends on the desired application of the printed circuit board and may be of importance for the described device and method. All materials which are electrical insulators, in particular plastics and ceramics, are conceivable and possible. As mentioned above, however, semiconductor chips may also be employed in the described method.

A suspension comprising purified and electrically conductive precursors of carbon nanotubes of different sizes in addition to catalysts and solvents is applied to the printed circuit board basic body. The suspension can be applied in a wide variety of ways, e.g., by being printed on and/or by being sprayed on. The application method chosen is chosen according to the physical properties of the suspension to be applied. The application of the suspension may preferably be carried out over the whole area, in a manner corresponding to a predetermined position and dimension of the strip conductors to be applied.

Next, the applied suspension is treated such that the precursors of carbon nanotube fragments contained therein combine to form electrically conductive carbon nanotube networks which correspond to the desired strip conductor layout in terms of their spatial arrangement.

Subsequently, residual carbon nanotube fragments, solvents and catalysts are removed from the printed circuit board. Contact connection areas are then applied at the end points of the strip conductors.

Thereafter, the strip conductors are covered with a polymer-like, electrically insulating layer for protecting the carbon nanotube network, so that the very fine carbon nanotube strip conductors are protected against damage and the dielectric strength is not defined via air clearances. In this case, contact areas are kept free for the fitting, e.g., of contacts or the fitting of further wiring systems.

Another method for the production of substrates with strip conductors for semiconductor components involves the following operations. A basic body comprising ceramic, semiconductor material or plastic with contact areas and/or through contacts is produced. Afterward, the basic body, already including through contacts and/or contact areas, is selectively coated with a wiring pattern comprising a suspension including precursors of carbon nanotubes. Thereafter, the coated basic body with the selectively coated suspension is heated, carbon nanotubes being formed as strip conductors between the contact areas and/or the through contacts. The difference from the method mentioned first is that the end points of the strip conductors are present on the basic body and the points are combined in a network of carbon nanotubes via the thermal treatment of the suspension to form a network.

In order to prepare the suspension, preferably a polymeric plastic is dissolved in a solvent and mixed with, e.g., precursors of carbon nanotubes produced in an arc. The precursors may comprise fragments of carbon nanotubes or include small hollow-spherical balls of carbon in the form of fullerenes that are likewise produced in an arc.

In a further exemplary implementation of the method, first, in order to prepare the suspension, carbon nanotubes are produced in a heating tube with a supply of powder mixture comprising graphite particles, preferably made from carbon fullerenes, and catalyst metal particles in a laser beam. Furthermore, it is possible, for the preparation of the suspension, first to produce carbon nanotubes in a pressure tube furnace via vapor phase deposition with supply of carbon monoxide and hydrogen and then to mix them with a polymeric plastic and a solvent to form a suspension. Preferably, a fluoropolymer and/or a tetrafluoroethylene and/or a polyvinyl fluoride are used as polymeric plastic. Polymers based on PBO (phenylene benzodioxol) can also be mixed with precursors of carbon nanotubes to form corresponding suspensions.

In a further exemplary implementation of the method for the production of strip conductors and substrates for semiconductor components, the method includes the following. The first step involves, as in the preceding method, producing a basic body comprising ceramic, semiconductor material or plastic with contact areas and/or through contacts which are intended to serve as end points for the strip conductors of the substrate. Afterward, the basic body is selectively coated with a catalyst metal.

Subsequently, carbon nanotubes are deposited on the structured coating comprising a catalyst metal to form strip conductors between the contact areas and/or the through contacts. For producing a selective coating, a printing technique can be used in all cases. Use is preferably made of a jet printing technique analogously to inkjet printing in order to apply correspondingly closely adjacent tracks of a suspension or of a catalyst material on the substrate or on the basic body. For coarser structures it is also possible to use the screen printing technique or the stencil printing technique. A further possibility for achieving a selective coating and hence a structuring in the different method variants is effected via photolithographic techniques which are known and widespread in the semiconductor industry and fabrication. Furthermore, laser structuring is also possible.

Once a corresponding structure comprising catalyst metal is present on the basic body, in a further embodiment, carbon nanotubes can be deposited on the structured catalyst metal from a mixture comprising carbon fullerenes, inert gas and carbon monoxide in a heating tube in which the substrate is positioned. In this case, as soon as the carbon fullerenes touch the structured catalyst metals they develop into carbon nanotubes along the predetermined structure.

In a further variant of an implementation of the method, the deposition of carbon nanotubes on the structured catalyst metal is achieved from a mixture comprising carbon monoxide and hydrogen in a pressure tube furnace at 500 to 800° C. in which the substrate with the applied catalyst structure is positioned. For a deposition of this type, however, the material of the basic body is restricted to semiconductor chips and/or ceramic plates since plastic plates do not withstand the pressure furnace temperatures without damage.

Furthermore, provision is made for carrying out the following method for the production of semiconductor components with substrates and strip conductors. First, a substrate with strip conductors comprising carbon nanotubes is produced, as described above. Afterward, at least one semiconductor chip is applied to the substrate. The contact areas of the semiconductor chip are connected to the strip conductor structure comprising carbon nanotubes of the substrate. Both the connections and the semiconductor chip are then embedded into a plastic housing composition.

Finally, external contacts can then be fitted to the semiconductor component. If the semiconductor substrate with its strip conductors is provided for a plurality of semiconductor components, as is the case, for example, with a panel, or in the case of other wiring substrates, this substrate for a plurality of semiconductor components can be separated into individual semiconductor components prior to the application of external contacts. The advantage afforded by this method for the production of a semiconductor component lies in the fact that the dimensions of the substrates can be minimized further and can be adapted to a greater extent to the order of magnitude of a semiconductor chip, thus giving rise to semiconductor components which correspond to the semiconductor chips in terms of their size.

In the following paragraphs, exemplary embodiments of the device and method are described in connection with the figures.

FIG. 1 shows an embodiment of a schematic plan view of a substrate 1 with a wiring pattern 4 using carbon nanotube technology. For this purpose, the substrate 1 includes an insulating baseplate or basic body 12 comprising two hundred and twelve contact connection areas 3 on the top side 19 as shown in FIG. 1, the contact connection areas being arranged in a manner distributed uniformly on the top side 19. The connection pitch 5 of the contact connection areas 3 is relatively wide, so that large-volume external contacts can be fitted on the substrate 1. For this purpose, through contacts through the insulating baseplate 12 are provided in the region of the contact connection areas 3. Correspondingly large external contact areas that are suitable for example for fitting two hundred and twelve solder balls are present on the opposite underside (not shown here) of the baseplate 12.

While the connection pitch of the external contact areas is unproblematic, the external contact areas must be connected to contact areas 16 in the center of the baseplate 12, however. The number of contact areas 16 in the center is greater again by a factor of 3.5 than the number of contact connection areas 3 on the basic body 12. The connection pitch 18 of these seven hundred and eighty contact areas 16 arranged in the center is one order of magnitude narrower than the connection pitch 5 of the contact connection areas 3.

In order to connect the two hundred and twelve contact connection areas 3 to the seven hundred and eighty contact areas 16 via corresponding strip conductors 2, one hundred and ten gaps are available on the four edges of the central connection pattern, on which gaps strip conductors 2 can reach the seven hundred and eighty contact areas 16. That is to say that in each case two strip conductors 2 must pass between the contact areas 16 in order to route the two hundred and twelve outer contact connection areas inward in one layer, so that the spacing or the connection pitch is reduced once again by a factor of 3 for the strip conductors 2 in comparison with the connection pitch 18. In the case of significantly fewer parallel Vdd, Vss pads and in the case of chip-to-chip connections, the substrate crisis also increases significantly. In this case, the external pin count may possibly even decrease. Given an edge length of the substrate shown here of 1 cm or 10,000 micrometers, a connection pitch of 10 μm has to be provided for the strip conductors 2 between the contact areas 16 in order to connect the two hundred and twelve contact connection areas via strip conductors 2 to corresponding contact areas 16 in the center of the substrate 1.

In order to achieve this, the strip conductors 2 comprise carbon nanotubes 6 which can be realized as multiwalled carbon nanotubes 6 having a diameter of 2 nm to 300 nm. In this embodiment in accordance with FIG. 1, agglomerates of carbon nanotubes 6 form the strip conductors 2, so that the individual nanotube has a diameter of between 10 and 30 nm. The connection pitch 5 of the contact connection areas 3, with a value of 650 μm (=standard pitch of a BGA), is large enough to position solder balls as external contacts on the rear side of the present substrate 1. The embodiment as shown in FIG. 1 is an example of the described device and although specific features (e.g., inter alia, the number of contact connection areas, the number of contact areas and the number of strip conductors) are disclosed for this specific embodiment, it is to be understood that various changes and modifications can be made therein without departing from the spirit and scope thereof. Accordingly, it is intended that the described device covers the modifications and variations provided they come within the scope of the appended claims and their equivalents.

Figure 2:
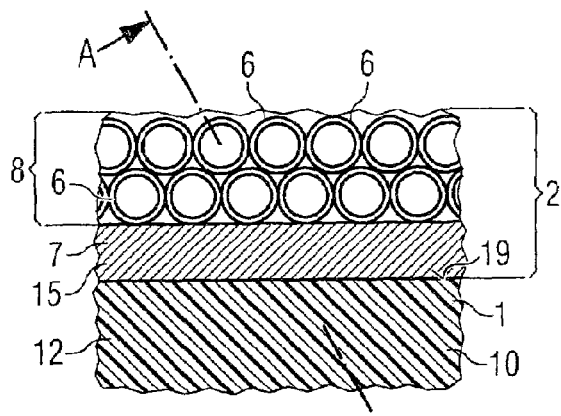
FIG. 2 shows a schematic cross section through a strip conductor in accordance with a first embodiment.

FIG. 2 shows a schematic cross section through a strip conductor 2 of a first embodiment. The strip conductor 2 forms a composite material made from two layers which are arranged on a basic body 12 as insulation layer 10 or on an insulation film. On the top side 19 of the basic body 12, the strip conductor 2 of this embodiment comprises a base layer 7 of a catalyst metal 15. On the catalyst metal 15, carbon nanotubes 6 are arranged as a stack layer 8 along the strip conductor 2.

Figure 20:
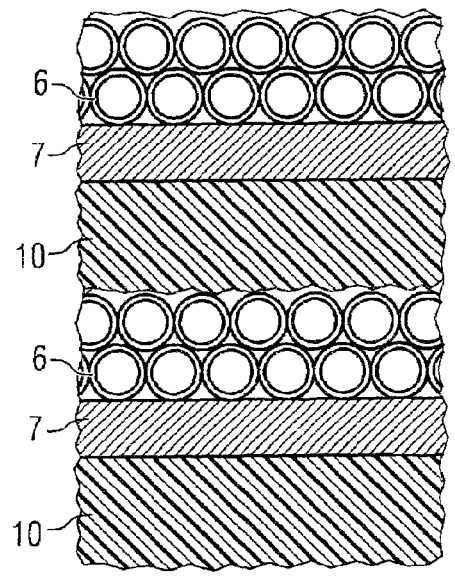
FIG. 20 shows a schematic cross section through a plurality of strip conductor layers, where each layer has a configuration similar to the strip conductor depicted in FIG. 2.

FIG. 20 shows an example embodiment in which a plurality of strip conductor layers with carbon nanotubes 6 are provided in relation to each other, where each layer is similar to the strip conductor arrangement shown in FIG. 2. In particular, the arrangement depicted in FIG. 20 includes a plurality of strip conductor layers, each layer including an insulation layer 10, a base layer 7 of a catalyst metal, and a stack layer of carbon nanotubes 6. With this arrangement, the conducting line density can be increased further, and the strip conductors can advantageously be electrically interconnected through correspondingly prepared plated-through holes via carbon nanotubes in the insulation layers.

Figure 21:
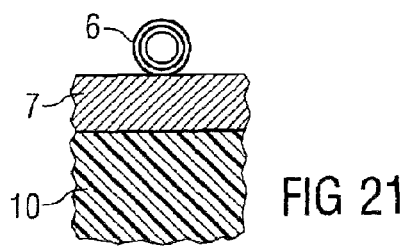
FIG. 21 shows a schematic cross section through a strip conductor including a multi-walled carbon nanotube.

FIG. 21 shows an example embodiment in which an individual strip conductor of the substrate includes an individual multiwalled carbon nanotube 6. In this embodiment, an extremely narrow connection pitch is realized.

The embodiment of FIG. 2 is formed in two stages. First, the base layer 7 comprising a catalyst metal 15 such as iron, nickel, cobalt or molybdenum is applied on the top side 19 of the basic body 12 and the carbon nanotubes 6 are then formed onto the base layer from a suspension or in a vapor phase deposition, as described above.

Figure 3:
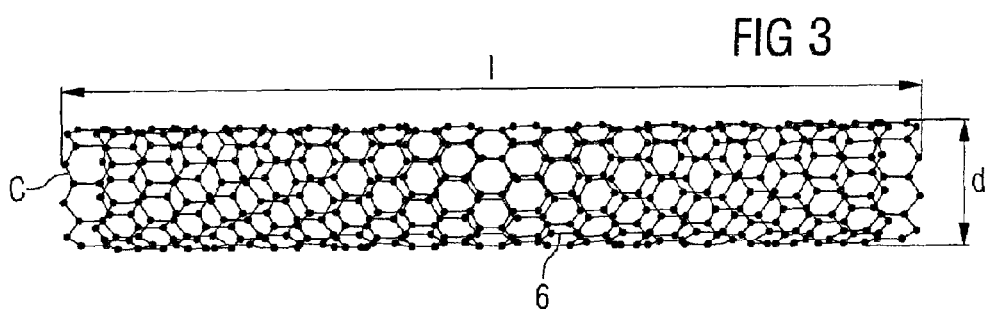
FIG. 3 shows a three-dimensional schematic illustration of a single-walled carbon nanotube with carbon atoms arranged hexagonally.

FIG. 3 shows a three-dimensional schematic illustration of a single-walled carbon nanotube 6 with hexagonally arranged carbon atoms C. This hexagonal arrangement comprising 6 carbon atoms C corresponds to the known benzene ring, which represents a preferred structure of the carbon, electron double bonds in each ring rotating in order to stabilize the ring, which promotes the electrical conductivity of a carbon nanotube 6 of this type. The length 1 may extend from a few tens of nanometers to a few millimeters. The diameter d for the single-walled carbon nanotube 6 illustrated in FIG. 3 lies within the range of 0.6 to 1.8 nm. In the case of multiwalled carbon nanotubes 6, cylindrical walls arranged coaxially are nested in one another, so that multilayered carbon nanotubes 6 can attain a diameter of from 2 nm up to 300 nm. In the embodiment, the carbon nanotubes 6 have a preferred diameter range of $10\ nm \leqq d \leqq 30\ nm$.

Figure 4:
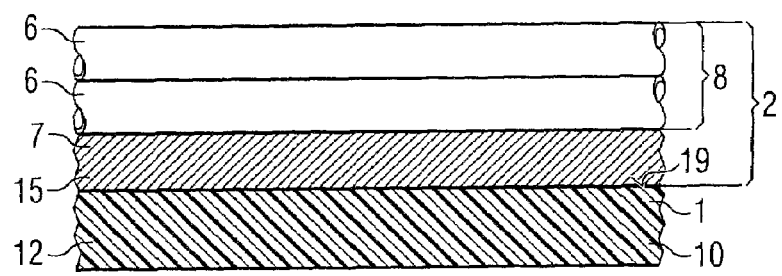
FIG. 4 shows a schematic cross section through a strip conductor in the longitudinal direction in accordance with the first embodiment according to FIG. 2.

FIG. 4 shows a schematic cross section through a strip conductor 2 in the longitudinal direction along the sectional plane A-A in FIG. 2 in accordance with the embodiment. The stack layer 8 of this strip conductor 2 on the base layer 7 comprises carbon nanotubes 6 which lie on one another and are arranged approximately in the direction of the longitudinal extent of the strip conductor. Whereas only an agglomerate of two layers made from carbon nanotubes 6 is shown here, it is possible, however, for any desired number of carbon nanotubes 6 to be stacked one above another without increasing the strip conductor width.

FIGS. 5 to 11 show cross sections and plan views of components during the production of a semiconductor component with a substrate 1 comprising strip conductors 2 with carbon nanotubes 6. Components with functions identical to those in the previous figures are identified by identical reference symbols and are not discussed separately in FIGS. 5 to 11.

FIG. 5 shows a schematic cross section through a substrate 1 with through contacts 9 using carbon nanotube technologies. For this purpose, a basic body 12 made from an insulating material was produced as baseplate for the construction of a semiconductor component. The basic body 12 may have a plurality of semiconductor component positions for the simultaneous production of a plurality of semiconductor components. FIG. 5 shows one of the semiconductor component positions 29. This position includes through contacts 9 through the basic body 12 in its center. The pressure contacts made from carbon nanotubes 6 extend from the top side 19 of the basic body 12 to the underside 20 of the basic body 12. The carbon nanotubes 6 project from the underside 20 with their ends 25 and have a columnar structure made from an agglomerate of carbon nanotubes 6.

FIG. 6 shows a schematic plan view of a substrate 1 with through contacts 9 using carbon nanotube technologies, adapted to a semiconductor chip with a central bonding channel. The through contacts 9 therefore have a connection pitch 18 corresponding to the connection pitch 18 of the contact areas of the semiconductor chip in terms of size and arrangement.

FIG. 7 shows a schematic cross section through the substrate 1 according to FIG. 5 with applied contact connection areas 3 in a connection pitch 5. For this purpose, there is applied to the top side 19 a selective metal coating which comprises contact areas 16 only on the through contacts 9 and exhibits a further connection pitch 5 of contact connection areas 3 in the edge regions. The metal coating may also be embodied in multilayered fashion and preferably comprises copper or a corresponding copper alloy which is covered by a diffusion-inhibiting nickel layer and a solder alloy.

FIG. 8 shows a schematic plan view of the substrate 1 in accordance with FIG. 7 with an applied carbon nanotube wiring. In order to be able to connect the two rows of contact areas 16 in a narrow connection pitch 18 to correspondingly large contact connection areas 3 having a wide connection pitch 5, four rows of contact connection areas 3 having a wide connection pitch 5 outside the region of a central bonding channel are required in this semiconductor component position on the basic body 12 for an individual row of contact areas 16 in the bonding channel region. The fourth row of contact connection areas 3 has been omitted in order to simplify the drawing.

Before the carbon nanotubes are produced, a wiring structure 4 comprising a catalyst metal 15 having a strip conductor width b was applied to the substrate. The top side 19 of the basic body 12 may subsequently be coated with a suspension from which preliminary products in the form of seeds are applied onto the structure of the catalyst metal 15. During a corresponding heat treatment step at elevated temperature, the desired carbon nanotubes 6 form as strip conductors 2 between the contact areas 16 in the bonding channel region of a semiconductor chip and the contact connection areas 3 for external contacts of a semiconductor component.

FIG. 9 shows a schematic cross section through the substrate 1 in accordance with FIG. 8. This cross section essentially corresponds to FIG. 7 and now additionally shows the carbon nanotubes 6 formed as elastic connecting strip conductor between the contact areas 16 and the contact connection areas 3.

FIG. 10 shows a schematic cross section through the substrate 1 in accordance with FIG. 9 after the application of a semiconductor chip 11 with a central bonding channel 21. The central bonding channel 21 is left free of a double-sided adhesive film 22 in order that the ends 25 of the pressure contact 9 made from carbon nanotubes 6 that project from the underside 20 can form a pressure contact with the contact areas 16 of the semiconductor chip 11 in the bonding channel 21. For this purpose, a double-sided adhesive film 22 is applied to the original rear side 20 of the substrate 1, while an additional soldering resist layer is applied on the original top side 19, which now forms the underside in FIG. 10, with the contact connection areas 3 being left free. The soldering resist layer 26 is an insulation layer and simultaneously protects the carbon nanotubes 6 on the top side of the substrate 1 against mechanical damage.

The contact with the semiconductor chip 11 or with the contact areas 16 thereof can be produced by virtue of the fact that the carbon nanotube bundles that form the through contacts 9 extend beyond the underside 20 of the substrate 1 with their ends 25. Upon application of the semiconductor chip 11, the pressure contacts 9 are thus automatically elastically connected to the contact connection areas 16 of the semiconductor chip 11 on account of the elastic ends 25 of the carbon nanotube bundles 6 that form the through contacts 9.

In this case, the property of the relatively high deformability of the carbon nanotubes is advantageous since they press against the contact areas 16 in an elastically resilient manner.

FIG. 11 shows a schematic cross section through components of a semiconductor component 14 after the application of a plastic housing composition 17 and after the application of external contacts 13. These steps of application of a housing plastic composition 17 and of application of external contacts 13 can be carried out for an entire substrate strip 28, which may comprise a plurality of semiconductor component positions 29, which makes production less expensive especially if it is only afterward that the substrate strip 29 is separated into individual semiconductor components 14 along the separation joints 27. A further advantage of the method is that it is not necessary to carry out a soldering process for electrically connecting the through contacts 9 to the contact connection areas 16 of the semiconductor chip 11 during the production of the semiconductor component 14 and, consequently, this connection is not melted again during the later assembling/soldering of these components onto the printed circuit board.

FIGS. 12 to 19 show a further exemplary implementation of the method for the production of strip conductors 2 with carbon nanotubes 6. Components having functions identical to those in the previous figures are identified by identical reference symbols in FIGS. 12 to 19 and are not discussed separately.

FIG. 12 shows a schematic plan view of a substrate with semiconductor chip and openings 23 in the substrate to contact areas 16 of the semiconductor chip. The openings 23 in the substrate 1 correspond in terms of their arrangement and their connection pitch 18 to contact areas 16 of a single-row bonding channel of the semiconductor chip arranged under the substrate.

FIG. 13 shows a schematic cross section through the semiconductor chip 11 in accordance with FIG. 12. Arranged on the semiconductor chip 11 is the substrate 1, which comprises a plastic film including openings 23 thereby leaving free corresponding contact areas 16 of the semiconductor chip. In this embodiment, the substrate 1 in the form of a plastic film is not self-supporting; rather it is supported on the active top side 24 of the semiconductor chip 11.

Figure 14:
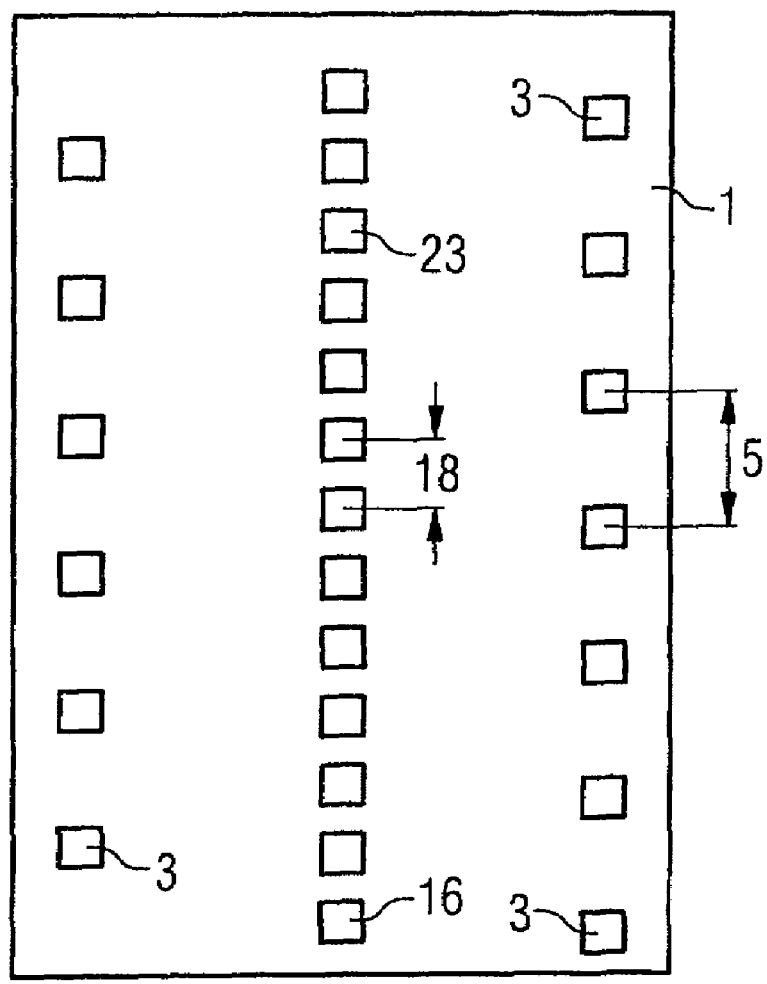
FIG. 14 shows a schematic plan view of the substrate in accordance with FIG. 13 after the application of contact connection areas to the substrate.

FIG. 14 shows a schematic plan view of the substrate 1 in accordance with FIG. 13 after the selective application of contact connection areas 3 to the substrate. While the central openings 23 with the contact areas 16 are arranged in a narrow connection pitch 18, the contact connection areas 3 can be arranged in a wide connection pitch 5, which is twice as large as the connection pitch dimension 18, and an associated contact connection area 3 can nevertheless be made available on the substrate 1 for each contact area 16.

Figure 15:
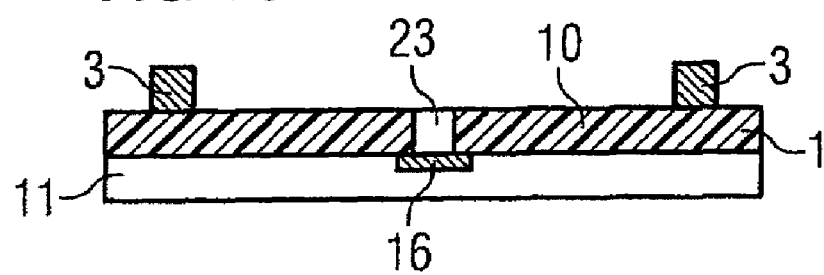
FIG. 15 shows a schematic cross section through the substrate in accordance with FIG. 14.

FIG. 15 shows a schematic cross section through the substrate in accordance with FIG. 14. It should be noted in this case that the areal extent of the semiconductor chip 11 corresponds to the areal extent of the substrate 1. This is possible because correspondingly narrow connection pitches become possible on account of the carbon nanotube technology employed here.

Figure 16:
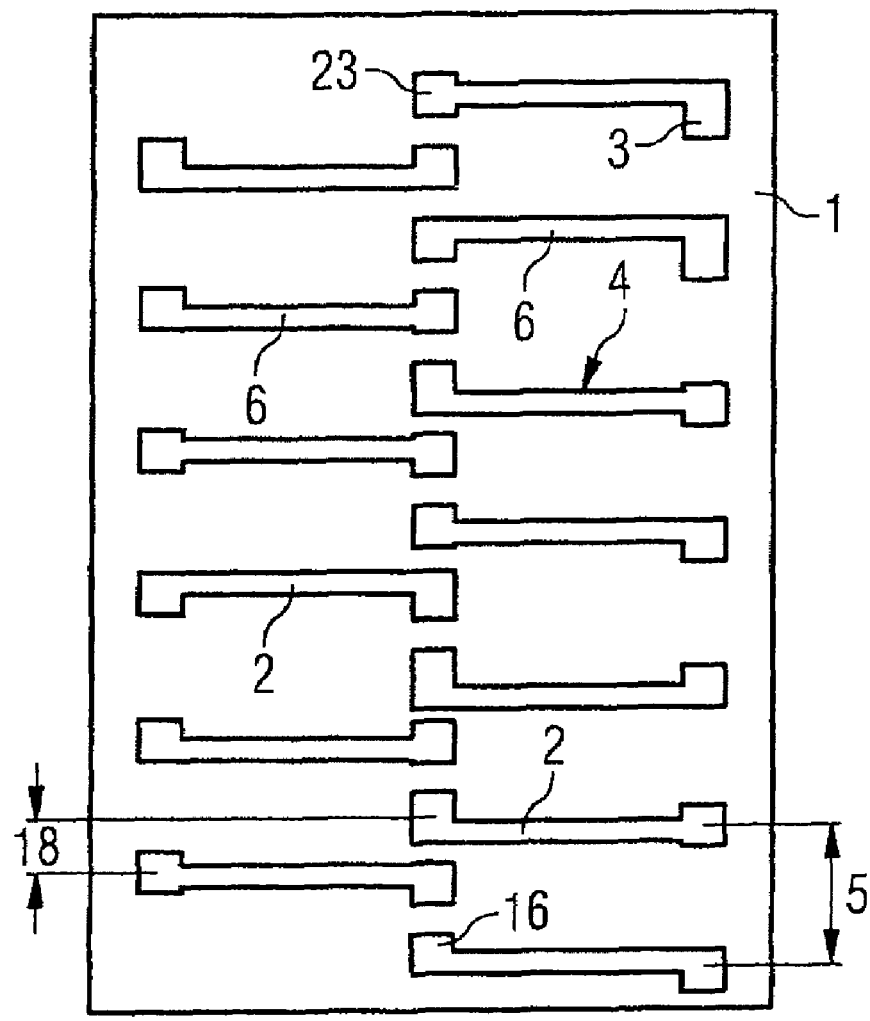
FIG. 16 shows a schematic plan view of the substrate in accordance with FIG. 15 after printing on a structure for forming nanotube connections.

FIG. 16 shows a schematic plan view of the substrate in accordance with FIG. 15 after printing on a structure for forming carbon nanotubes 6 as strip conductors 2. In this case, during the printing process, the openings 23 for the central contact area 16, which are arranged in a row, can also be filled with a corresponding suspension. The contact connection areas 3 of the substrate 1 can also be covered by such a suspension via jet printing technology. During a subsequent heat treatment of the suspension, which has preliminary products of the carbon nanotubes 6 and particles comprising a capacitor metal, carbon nanotubes 6 can be formed as strip conductors 2.

Figure 17:
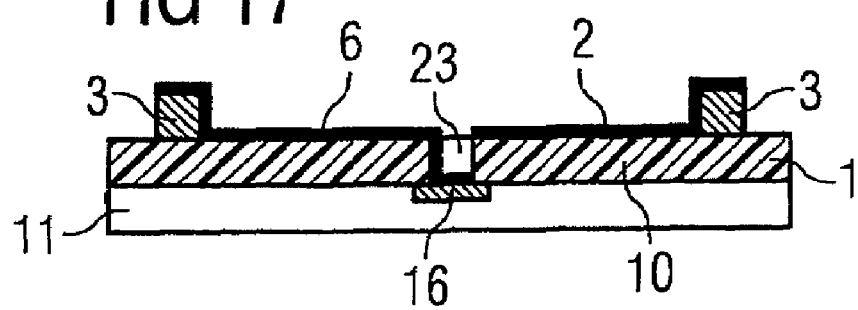
FIG. 17 shows a schematic cross section through the substrate in accordance with FIG. 16.

FIG. 17 shows a schematic cross section through the substrate 1 in accordance with FIG. 16, the strip conductors 2 comprising carbon nanotubes 6 extending from the contact areas 16 of the semiconductor chip 11 as far as the contact connection areas 3 of the substrate 1.

FIG. 18 shows a schematic plan view of the substrate 1 in accordance with FIG. 17 after the formation of nanotube connections in the printed-on material.

FIG. 19 shows a schematic cross section through the substrate 1 in accordance with FIG. 18. For this purpose, the substrate 1 with the suspension was brought into a heat treatment furnace and the solvent of the suspension was evaporated, while the plastic nanotubes 6 are formed as strip conductors 2 of the printed suspension.

While devices and methods have been described in detail with reference to specific embodiments thereof, it will be apparent to one of ordinary skill in the art that various changes and modifications can be made therein without departing from the spirit and scope thereof. Accordingly, it is intended that the invention cover the modifications and variations of the device and method provided they come within the scope of the appended claims and their equivalents.

What is claimed is:

1. A substrate, comprising:
    a plurality of strip conductors with a small strip conductor width; and
    a plurality of contact areas on a top side of the substrate, the strip conductors comprising a wiring pattern that connects the contact areas to one another,
    wherein the strip conductors and/or the contact areas form a narrow connection pitch and include electrically conductive carbon nanotubes.

2. The substrate as claimed in claim 1, wherein the carbon nanotubes has a diameter d, where 10 nm$\leq$d$\leq$30 nm.

3. The substrate as claimed in claim 1, wherein the carbon nanotubes have a length on the order of tens of nanometers to a few millimeters.

4. The substrate as claimed in claim 1, wherein the plurality of strip conductors comprise an agglomerate of carbon nanotubes.

5. The substrate as claimed in claim 1, wherein the plurality of strip conductors comprise multiwalled carbon nanotubes lying alongside one another in the longitudinal direction.

6. The substrate as claimed in claim 1, wherein at least one of the strip conductors of the substrate comprises an individual multiwalled carbon nanotube.

7. The substrate as claimed in claim 1, wherein the plurality of strip conductors are multilayered, the strip conductors comprising:
- a base layer including a catalyst material for carbon nanotubes; and
- a stack layer with carbon nanotubes.

8. The substrate as claimed in claim 7, wherein the base layer comprises at least one metal from the group including nickel, iron, molybdenum, cobalt and alloys thereof.

9. The substrate as claimed in claim 1, wherein the substrate further comprises:
- a plurality of strip conductor layers, wherein the strip conductor layers include the strip conductors with carbon nanotubes; and
- a plurality of insulating layers, the strip conductor layers being electrically insulated from one another by the insulation layers.

10. The substrate as claimed in claim 1, wherein the substrate further comprises:
- at least one insulation layer including at least one carbon nanotube as a through contact extending through the insulation layer.

11. The substrate as claimed in claim 1, wherein the substrate further comprises:
- at least one insulation layer including an agglomerate of carbon nanotubes as a through contact extending through the insulation layer.

12. The substrate as claimed in claim 1, wherein the substrate further comprises:
- at least one insulation layer including at least one columnar structure of carbon nanotubes that lie on one another and are oriented orthogonally with respect to the insulation layer as a through contact extending through the insulation layer.

13. The substrate as claimed in claim 1, wherein the substrate further comprises at least one of the group including: a circuit carrier, a wiring substrate, a semiconductor chip and a printed circuit board.

14. The substrate as claimed in claim 1, wherein the substrate further comprises an insulating baseplate comprising at least one of the group including: ceramic, semiconductor material, and plastic.

15. The substrate as claimed in claim 14, wherein the plastic comprises a fiber-reinforced synthetic resin.

16. A semiconductor component, comprising:
- a plurality of external contacts; and
- a substrate comprising: a plurality of strip conductors with a small strip conductor width; and a plurality of contact areas on a top side of the substrate, the strip conductors comprising a wiring pattern that connects the contact areas to one another, wherein the strip conductors and/or the contact areas define a narrow connection pitch and include electrically conductive carbon nanotubes.

* * * * *

UNITED STATES PATENT AND TRADEMARK OFFICE
CERTIFICATE OF CORRECTION

PATENT NO. : 7,504,711 B2  Page 1 of 1
APPLICATION NO. : 11/625393
DATED : March 17, 2009
INVENTOR(S) : Gottfried Beer et al.

It is certified that error appears in the above-identified patent and that said Letters Patent is hereby corrected as shown below:

Column 12, Line 53 Claim 1, replace "form" with -- define --;

Column 12, Lines 57 & 58 Claim 2, replace "wherein the carbon nanotubes have" with -- wherein each of the carbon nanotubes has --.

Signed and Sealed this

Twenty-third Day of June, 2009

JOHN DOLL
*Acting Director of the United States Patent and Trademark Office*